(12) United States Patent
Ryoo

(10) Patent No.: US 6,784,060 B2
(45) Date of Patent: Aug. 31, 2004

(54) METHOD FOR FABRICATING HIGH VOLTAGE AND LOW VOLTAGE TRANSISTORS

(75) Inventor: Doo Yeol Ryoo, Cheongjoo (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/615,238

(22) Filed: Jul. 9, 2003

(65) Prior Publication Data

US 2004/0080014 A1 Apr. 29, 2004

(30) Foreign Application Priority Data

Oct. 29, 2002 (KR) .................... 10-2002-66116

(51) Int. Cl.[7] .......................................... H01L 21/8234
(52) U.S. Cl. ...................... 438/275; 438/287; 438/981; 438/775
(58) Field of Search ................ 438/275, 287, 438/775, 981

(56) References Cited

U.S. PATENT DOCUMENTS 6,653,192 B1 * 11/2003 Ryoo .......................... 438/275

OTHER PUBLICATIONS

C. H. Chen, et al; "Thermally–Enhanced Remote Plasma Nitrided Ultrathin (1.65nm) Gate Oxide with Excellent Performances in Reduction of Leakage Current and Boron Diffusion"; IEEE Electron Device Letters, vol. 22, No. 8; Aug. 2001; pp. 378–380.

Hoon Lim, et al; "The Effects of STI Process Parameters on the Integrity of Dual Gate Oxides"; IEEE 01CH37167 39th Annual International Reliability Physics Symposium, 2001; pp. 48–51.

S. Song, et al; "On the Gate Oxide Scaling of High Performance CMOS Transistors"; 2001 IEEE; IEDM 01–55 to IEDM 01–58.

* cited by examiner

Primary Examiner—Long Pham
(74) Attorney, Agent, or Firm—Jacobson Holman PLLC

(57) ABSTRACT

Disclosed are a transistor in the semiconductor device and method of fabricating the same. A gate oxide film is formed using a nitrification oxide film in a low voltage device region and a gate oxide film is formed to have a stack structure of a nitrification oxide film/oxide film/nitrification oxide film in a high voltage device region. An electrical thickness by an increased dielectric constant could be reduced even when a physical thickness of the gate oxide film is increased. The leakage current and diffusion and infiltration of a dopant into the gate oxide film or the channel region could be prevented. Furthermore, an electrical characteristic of the device could be improved by reducing the leakage current.

8 Claims, 2 Drawing Sheets

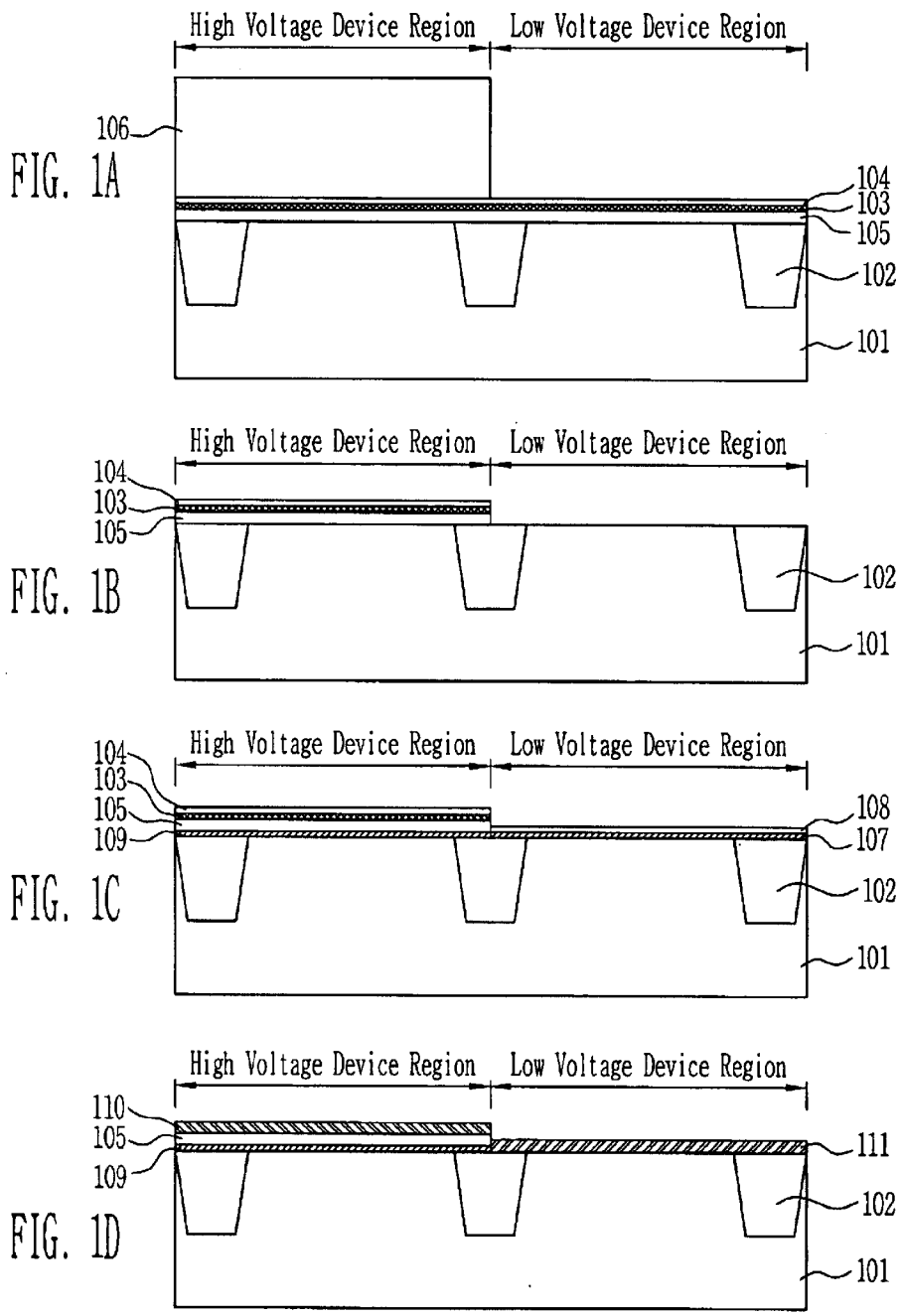

METHOD FOR FABRICATING HIGH VOLTAGE AND LOW VOLTAGE TRANSISTORS

BACKGROUND OF THE INVENTION

1. Field of the Invention

The present invention relates to a transistor in a semiconductor device and method of fabricating the same, and more particularly, to a transistor in a semiconductor device and method of fabricating the same, in which gate oxide films of different thickness are formed in a high voltage device region and a low voltage device region.

2. Background of the Related Art

In general, the semiconductor device such as the transistor can be classified into a device driven by a high voltage and a device driven by a low voltage. For this reason, in a high voltage operating transistor and a low voltage operating transistor have, the thickness of the gate oxide film is different. A method of forming the gate oxide films having different thickness in the high voltage device region and the low voltage device region, respectively, will be described in short.

A first gate oxide film is first formed in a first thickness on the entire structure of the semiconductor substrate. After forming a photoresist pattern through which only the low voltage device region is opened, the first gate oxide film formed in the low voltage device region is removed. Next, the photoresist pattern is removed. A second gate oxide film is then formed in a second thickness on the entire structure. Thereby, a thick gate oxide film on which the first and second gate oxide films are stacked is formed in the high voltage device region and only the second gate oxide film is formed in the low voltage device region, so that the gate oxide film thinner than the gate oxide film formed in the high voltage device region is formed.

As in the above, as the thin gate oxide film is formed in the low voltage device region, the leakage current through the gate insulating film is significantly increased. Due to this, there are problems that the power consumption of the device is increased and reliability of the device is lowered. Accordingly, there is a physical limit in reducing the thickness of the gate oxide film.

Furthermore, in case of the transistor of a p type electrode, a dopant implanted into the gate is infiltrated into the gate insulating film or what is more into the channel region of the semiconductor substrate to change the threshold voltage of the transistor, in the course of implementing an annealing process in order to improve the film quality of the gate electrode and form a LDD (lightly doped drain) region and a source/drain region.

In case of a n type transistor, hot carriers that obtained energy higher than the energy barrier at the interface of the semiconductor substrate and the gate insulating film by the electric field are introduced into the gate insulating film while moving from the source to the drain. Due to this, there are problems that the electric characteristic of the transistor is varied and reliability of the device is degraded.

SUMMARY OF THE INVENTION

Accordingly, the present invention is contrived to substantially obviate one or more problems due to limitations and disadvantages of the related art, and an object of the present invention is to provide a transistor in a semiconductor device and method of fabricating the same, which can reduce an electrical thickness of a gate oxide film by an increase of the dielectric constant although a physical thickness of the gate oxide film is increased, prevent the leakage current and diffusion and infiltration of a dopant into a gate oxide film or the channel region and improve an electrical characteristic of the device by reducing the leakage current, in such a way that the gate oxide film is formed in a low voltage device region using a nitrification oxide film and a gate oxide film is formed in a high voltage device region using a stack structure of the nitrification oxide film/oxide film/nitrification oxide film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a transistor in a semiconductor device according to an embodiment of the present invention is characterized in that it comprises a gate electrode formed in a given pattern in a low voltage device region and a high voltage device region on a semiconductor substrate, source/drain formed in the semiconductor substrate at both corners of the gate electrode, a first gate oxide film formed between the gate electrode and the semiconductor substrate in the low voltage device region and having a first nitrification oxide film, and a second gate oxide film formed between the gate electrode and the semiconductor substrate in the high voltage device region and having a stack structure of a second nitrification oxide film/oxide film/third nitrification oxide film.

In the above, the concentration of nitrogen in the first nitrification oxide film could be controlled to be 10~15% and the concentration of nitrogen in the second nitrification oxide film or the third nitrification oxide film could be controlled to be 0.1%~3%.

Meanwhile, a thickness of the first gate oxide film is 12~20 Å and a thickness of the second gate oxide film is 35~55 Å.

A method of fabricating a transistor in a semiconductor device according to an embodiment of the present invention is characterized in that it comprises the steps of simultaneously growing a first nitrification oxide film on the entire structure of a semiconductor substrate in which a low voltage device region and a high voltage device region are defined and a first oxide film on the first nitrification oxide film, forming a second oxide film below the first nitrification oxide film, removing the first oxide film, the first nitrification oxide film and the second oxide film formed in the low voltage device region, simultaneously growing a second nitrification oxide film in the low voltage device region and a third oxide film on the second nitrification oxide film, and at the same time growing a third nitrification oxide film between the second oxide film and the semiconductor substrate in the high voltage device region, nitrifying the first oxide film of the high voltage device region to form a fourth nitrification oxide film formed along with the first nitrification oxide film and nitrifying the third oxide film of the low voltage device region to form a fifth nitrification oxide film formed along with the second nitrification oxide film, by means of a nitrification treatment process, forming a conductive material layer on the entire structure, forming a stack structure of the first gate oxide film consisting of a fifth nitrification oxide film and a gate in the low voltage device region and a stack structure of the second gate oxide film consisting of the third nitrification oxide film/second oxide film/fourth nitrification oxide film and a gate in the high voltage device region, by means of a patterning process, and forming an insulating spacer at the sidewalls of the gate and source/drain in the semiconductor substrate at the sidewall of the gate.

In the above, the first~third nitrification oxide films may be formed using a $N_2O$ gas or a NO gas. At this time, the process using the NO gas may be implemented at a temperature of 750~950° C. while supplying $N_2$ of 5~10 slm and the NO gas of 300~900 sccm.

The second oxide film may be formed using an $O_2$ gas or a mixed gas of $O_2+H_2$.

The photoresist pattern formed in order to remove the first oxide film, the first nitrification oxide film and the second oxide film formed in the low voltage device region, is removed using an ozone water.

The nitrification treatment process is implemented using a remote plasma nitrification treatment process and may be implemented under $N_2$ and He atmosphere at a plasma power of 100~700W, a pressure of 50~1000 mTorr and a temperature of 180~500° C. for 20 seconds~5 minutes.

The concentration of nitrogen in the third nitrification oxide film or the fourth nitrification oxide film is 0.1%~3%. The concentration of nitrogen in the fifth nitrification oxide film is 10~15%.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 1a~FIG. 1g are cross-sectional views of semiconductor devices for explaining a transistor in the semiconductor device and method of fabricating the same.

DETAILED DESCRIPTION OF THE PREFERRED EMBODIMENT

Figure 1E:
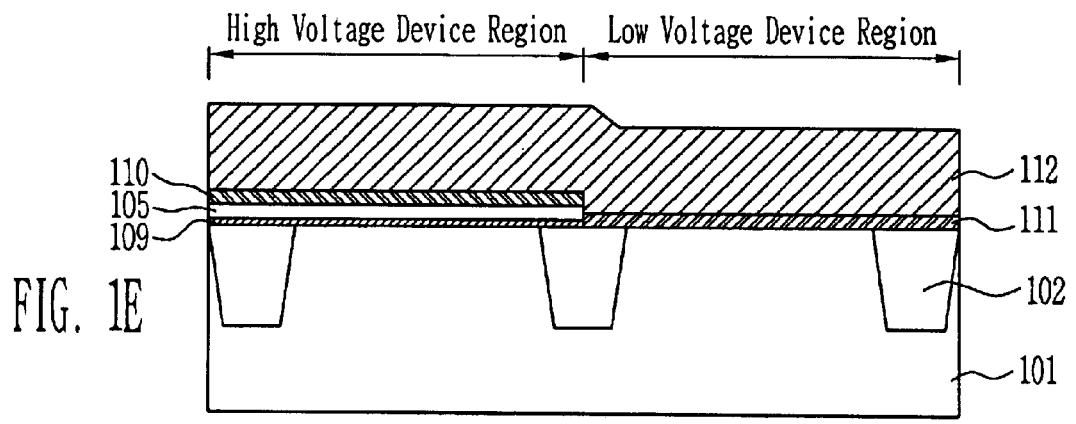

Reference will now be made in detail to the preferred embodiments of the present invention, examples of which are illustrated in the accompanying drawings, in which like reference numerals are used to identify the same or similar parts.

FIG. 1a~FIG. 1g are cross-sectional views of semiconductor devices for explaining a transistor in the semiconductor device and method of fabricating the same.

Referring now to FIG. 1a, an isolation film 102 for device isolation is formed at an isolation region of a semiconductor substrate 101. A n well and a p well (not shown) are then formed in the active region, respectively, depending on the type of a channel of the transistor. Next, p type and n type dopants are selectively implanted to form a channel ion implantation process (not shown) at a given depth of the well through a channel ion implantation process in order to control the threshold voltage of the transistor. After the n well, the p well and the channel ion implantation layer are formed through the above process, an isolation process for activating the implanted dopants is implemented and an annealing process is then performed. In the above, the isolation film 102 may be formed to have a STI (shallow trench isolation) structure. Thereafter, an oxide film (for example, a native oxide film; not shown) that may be formed on the surface of the semiconductor substrate 101 is removed by a wet etch process using ammonia and fluoric acid (HF series).

After the above process is finished, a first nitrification oxide film 103 and a first oxide film 104 are simultaneously formed on the entire structure of the semiconductor substrate 101 and the first nitrification oxide film 103, respectively, using a nitrogen containing gas. At this time, the nitrogen containing gas may include a $N_2O$ gas or a NO gas. The first nitrification oxide film 103 is formed while nitrogen ions are accumulated at the interface of the first oxide film 104 and the semiconductor substrate 101 as the first oxide film 104 is formed.

At this time, the process using the NO gas is performed while supplying $N_2$ of 5~10 slm and the NO gas of 300~900 sccm at a temperature of 750~950° C.

Thereafter, a second oxide film 105 is formed between the first nitrification oxide film 103 and the semiconductor substrate 101 using an $O_2$ gas or a mixed gas of $O_2+H_2$. Thereby, a stack structure of the second oxide film 105, the first nitrification oxide film 103 and the first oxide film 104 is formed on the semiconductor substrate 101. Next, a photoresist pattern 106 through which only the low voltage device region is opened is formed on the semiconductor substrate 101.

By reference to FIG. 1b, the first oxide film 104, the first nitrification oxide film 103 and the second oxide film 105, which are formed in the low voltage device region, are removed using fluoric acid or a BOE (buffered oxide etchant) solution. The surface of he semiconductor substrate 101 in the low voltage device region is thus exposed.

With reference to FIG. 1c, the photoresist pattern (106 in FIG. 1b) is removed using an ozone water ($O_3+H_2O$). A second nitrification oxide film 107 and a third oxide film 108 are then simultaneously formed in the low voltage device region of the semiconductor substrate 101 and on the second nitrification oxide film 107, respectively, using a nitrogen containing gas. At this time, a $N_2O$ gas or a NO gas may be used as the nitrogen containing gas. Furthermore, the second nitrification oxide film 107 is formed while nitrogen ions are accumulated at the interface of the third oxide film 108 and the semiconductor substrate 101 as the third oxide film 108 is formed. At the same time, in the high voltage device region, a third nitrification oxide film 109 is formed between the second oxide film 105 and the semiconductor substrate 101. In the above, the concentration of nitrogen in the third nitrification oxide film 109 is 0.1~3% and the process using the NO gas is implemented while supplying $N_2$ of 5~10 slm and a NO gas of 300~900 sccm at a temperature of 750~950° C.

Turning to FIG. 1d, the first oxide film (104 in FIG. 1c) of the high voltage device region is nitrified by a nitrification treatment process to form a fourth nitrification oxide film 110 formed along with the first nitrification oxide film (103 in FIG. 1c). At the same time, the third oxide film (108 in FIG. 1c) of the low voltage device region is nitrified to form a fifth nitrification oxide film 111 formed along with the second nitrification oxide film (107 in FIG. 1c).

In the above, the concentration of nitrogen in the fourth nitrification oxide film 110 is 0.1~3% and the concentration of nitrogen in the fifth nitrification oxide film 111 is 10~15%. Meanwhile, the nitrification treatment process is performed in a remote plasma nitrification treatment process. The remote plasma nitrification (RPN) treatment process could be performed if only nitrogen or nitrogen and He gas that can generate plasma and can be nitrified are mounted. This treatment process has a characteristic that nitrifies the silicon oxide film (or the surface). This RPN process is implemented for 20 seconds~5 minutes under $N_2$ and He atmosphere at a temperature of 180~500° C., a plasma power of 100~700W and a pressure of 50~1000 mTorr. The fourth nitrification oxide film 110 and the fifth nitrification oxide film 111, both having a dielectric constant of 3~6.5, are formed by the RPN process.

Referring now to FIG. 1e, a conductive material layer 112 is formed on the entire structure of the semiconductor substrate 101. At this time, the conductive material layer 112 may be formed using a polysilicon layer.

Figure 1F:
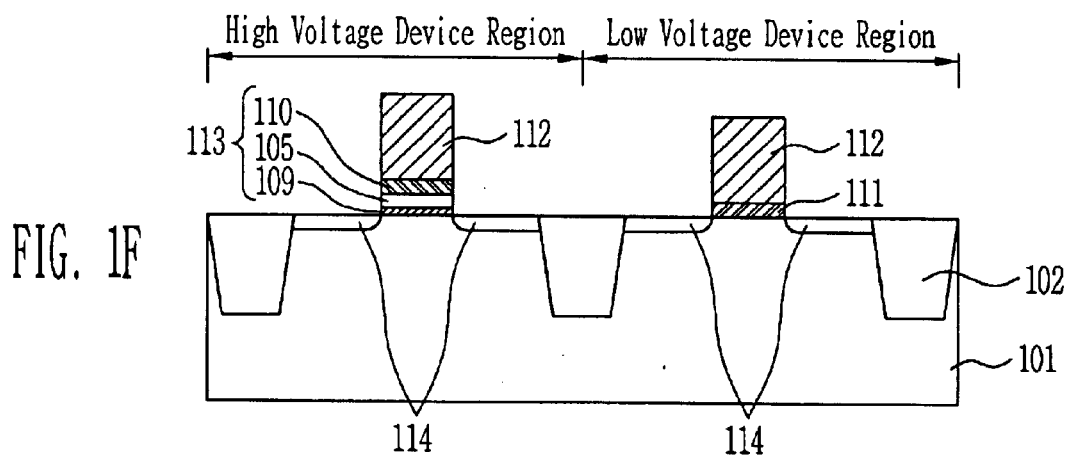
Figure 1G:
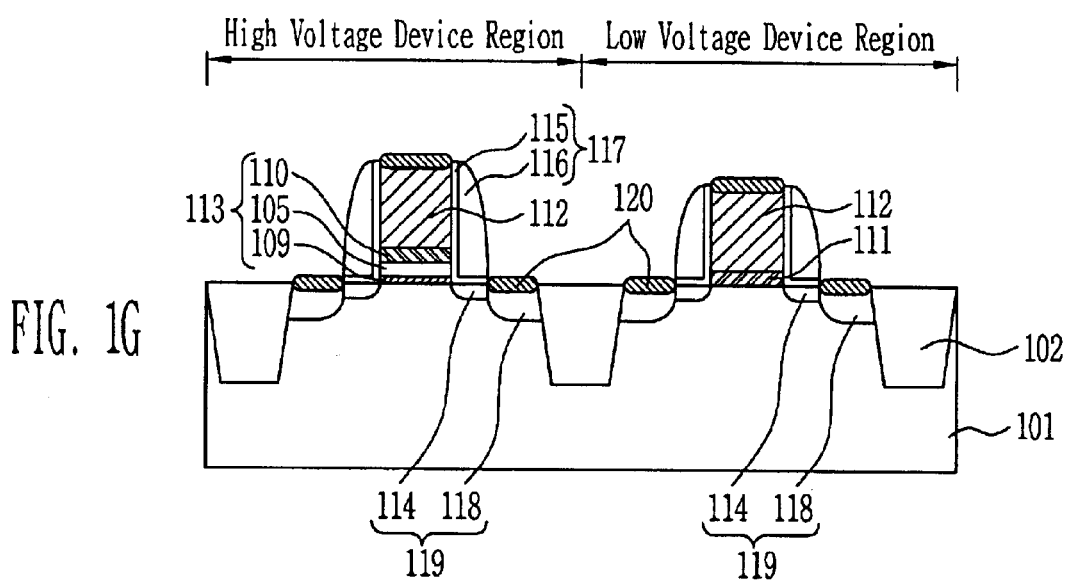

By reference to FIG. 1f, patterning is performed by means of an etch process using a gate mask. Thereby, a stack structure of the first gate oxide film 111 consisting of the fifth nitrification oxide film and the gate 112 is formed in the low voltage device region. Also, a stack structure of the second gate oxide film 113 consisting of the third nitrification oxide film 109/second oxide film 105/fourth nitrification oxide film 110 and the gate 112 is formed in the high voltage device region. At this time, the thickness of the second nitrification oxide film (107 in FIG. 1e) and the third oxide film (108 in FIG. 1e) in FIG. 1e are controlled so that the thickness of the first gate oxide film 111 becomes 12~20 Å. Furthermore, the thickness of the third nitrification oxide film (109 in FIG. 1e), the second oxide film (105 in FIG. 1e) and the fourth nitrification oxide film (110 in FIG. 1e) in FIG. 1a~FIG. 1e are controlled so that the thickness of the second gate oxide film 113 becomes 35~55 Å.

Thereafter, a low concentration ion implantation process using the gate 112 as an ion implantation mask is implemented to form low concentration ion implantation layers 114 for forming source/drain at both sides of the gate 112.

Turning to FIG. 1, a buffer oxide film 115 and a silicon nitride ($Si_3N_4$) 116 are sequentially formed on the entire structure. A blanket etch process is then implemented to have remained the buffer oxide film 115 and the silicon nitride film 116 only at the sidewalls of the gate 112, whereby an insulating spacer 117 consisting of the buffer oxide film 115 and the silicon nitride film 116 is formed. At this time, the buffer oxide film 115 may be formed using a LP-TEOS film.

Thereafter, a high concentration ion implantation process using the gate 112 and the insulating spacer 117 as an ion implantation mask is implemented to form high concentration ion implantation layers 118 in the semiconductor substrate 101 at the sidewalls of the insulating spacer 117. An annealing process is then performed to activate the implanted dopants. Thereby, source/drain 119 consisting of the low concentration ion implantation layer 114 and the high concentration ion implantation layer 118 is formed.

Next, silicide layers 120 are formed on the top surface of the gate 112 and the source/drain 119 in order to lower the contact resistance of the gate 112 and the source/drain 119 and a contact plug to be formed in a subsequent process. At this time, the silicide layer 120 may be formed in a self-aligned mode and may be formed to be a cobalt silicide layer using cobalt.

A method of forming the silicide layer 120 will be now described in more detail. A native oxide film on the surface of the gate 112 and the source/drain 119 is first removed. A metal layer (for example, cobalt; not shown) and a capping layer (for example, TiN; not shown) are then sequentially formed on the entire structure. Next, a silicon component of the gate 112 and the source/drain 119 and a metal component of the metal layer react to by means of a first annealing process, thus forming the silicide layer 120. After the capping layer and the not-reacted metal layer are removed, a second annealing process is implemented to improve the film quality of the silicide layer 120.

Thereby, transistors including the nitrification oxide films and having the gate oxide films of different structures and different thickness are formed in the high voltage device region and the low voltage device region, respectively.

As described above, the present invention can have the following effects by forming the gate insulating films in the low voltage device region and the high voltage device region, respectively, by the above method.

First, the dielectric constant is increased to about 3~6.5 by forming the gate insulating film using the nitrification oxide film instead of a common oxide film. Therefore, the thickness of an electrical gate oxide film can be reduced by about over 1.5 times than the existing oxide film and the leakage current can thus be reduced.

Second, a first gate oxide film of a thin thickness is formed using a nitrification oxide film having a high concentration of nitrogen (4~10%) and a second gate oxide film of a thick thickness is formed to have a stack structure in which a nitrification oxide film of a low concentration of nitrogen (below 3%) is formed between the oxide film and the substrate. Therefore, variation in the threshold voltage of the device could be prevented and reliability of the device could be improved, since a hot carrier immune characteristic at the n type semiconductor device is increased.

Third, the present invention employs a nitrification oxide film having a concentration of nitrogen of about 10~25% by nitrifying the top surfaces of the oxide films at the same time using the gate insulating film of a thick thickness and the gate insulating film of a thin thickness by a remote plasma nitrification method. It is thus possible to prevent infiltration of boron ions implanted into the gate electrode into the channel region in a p type semiconductor device. Therefore, a problem such as reduction in the threshold voltage by infiltration of boron, etc. can be solved, a margin of a subsequent annealing process can be expanded and reliability of the device can be increased.

Fourth, in case where the gate oxide film of a thick thickness is formed using the oxide film only and a plasma nitrification method is employed, the degree of nitrification is irregular and reliability of the device is degraded due to irregularity of the threshold voltage of the device. In order to solve these problems, in the present invention, after the nitrification oxide film is formed and is then oxidized again, the oxide film on a nitrification oxide film is nitrified by means of a remote plasma nitrification method. Accordingly, the present invention can implement the nitrification oxide film the degree of nitrification is uniform.

Fifth, a conventional process of forming a photoresist pattern, removing films formed in the low voltage device region and then removing the photoresist pattern using $O_2$ plasma degrades reliability of the oxide film since the oxide film of a low density is formed on the surface of the low voltage device region due to the $O_2$ plasma. On the contrary, the present invention can improve reliability of the gate oxide film by removing the photoresist pattern using an ozone water ($O_3+H_2O$).

What is claimed are:

1. A method of fabricating a transistor in a semiconductor device, comprising the steps of:

simultaneously growing a first nitrification oxide film on the entire structure of a semiconductor substrate in which a low voltage device region and a high voltage device region are defined and a first oxide film on the first nitrification oxide film;

forming a second oxide film below the first nitrification oxide film;

removing the first oxide film, the first nitrification oxide film and the second oxide film formed in the low voltage device region;

simultaneously growing a second nitrification oxide film in the low voltage device region and a third oxide film on the second nitrification oxide film, and at the same time growing a third nitrification oxide film between the second oxide film and the semiconductor substrate in the high voltage device region;

nitrifying the first oxide film of the high voltage device region to form a fourth nitrification oxide film formed along with the first nitrification oxide film and nitrifying the third oxide film of the low voltage device region to form a fifth nitrification oxide film formed along with the second nitrification oxide film, by means of a nitrification treatment process;

forming a conductive material layer on the entire structure;

forming a stack structure of a first gate oxide film consisting of a fifth nitrification oxide film and a gate in the low voltage device region and a stack structure of a second gate oxide film consisting of the third nitrification oxide film/second oxide film/fourth nitrification oxide film and a gate in the high voltage device region, by means of a patterning process; and forming an insulating spacer at the sidewalls of the gate and source/drain in the semiconductor substrate at the sidewall of the gate.

2. The method as claimed in claim 1, wherein the first~third nitrification oxide films are formed using a $N_2O$ gas or a NO gas.

3. The method as claimed in claim 2, wherein the process using the NO gas is implemented at a temperature of 750~950° C. while supplying $N_2$ of 5~10 slm and the NO gas of 300~900 sccm.

4. The method as claimed in claim 1, wherein the second oxide film is formed using an $O_2$ gas or a mixed gas of $O_2+H_2$.

5. The method as claimed in claim 1, wherein a photoresist pattern formed in order to remove the first oxide film, the first nitrification oxide film and the second oxide film formed in the low voltage device region is removed using an ozone water.

6. The method as claimed in claim 1, wherein the nitrification treatment process is implemented using a remote plasma nitrification treatment process and is implemented under $N_2$ and He atmosphere at a plasma power of 100~700 W, a pressure of 50~1000 mTorr and a temperature of 180~500° C. for 20 seconds 5 minutes.

7. The method as claimed in claim 1, wherein the concentration of nitrogen in the third nitrification oxide film or the fourth nitrification oxide film is 0.1%~3%.

8. The method as claimed in claim 1, wherein the concentration of nitrogen in the fifth nitrification oxide film is 10~15%.

* * * * *